(12) United States Patent
Li et al.

(10) Patent No.: US 7,111,271 B2
(45) Date of Patent: Sep. 19, 2006

(54) INDUCTIVE FILTERS AND METHODS OF FABRICATION THEREOF

(75) Inventors: Yuan-Liang Li, Chandler, AZ (US); David G. Figueroa, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 567 days.

(21) Appl. No.: 10/281,752

(22) Filed: Oct. 28, 2002

(65) Prior Publication Data

US 2003/0061591 A1    Mar. 27, 2003

Related U.S. Application Data

(62) Division of application No. 09/473,353, filed on Dec. 28, 1999, now Pat. No. 6,493,861.

(51) Int. Cl.
*G06F 17/50* (2006.01)
*H03K 17/693* (2006.01)

(52) U.S. Cl. .......................... 716/15; 716/12
(58) Field of Classification Search ................. 716/12, 716/15
See application file for complete search history.

(56) References Cited

U.S. PATENT DOCUMENTS

| | | | |
|---|---|---|---|
| 4,891,789 A * | 1/1990 | Quattrini et al. | 365/63 |
| 5,708,569 A * | 1/1998 | Howard et al. | 361/760 |
| 5,745,981 A * | 5/1998 | Roshen et al. | 29/607 |
| 5,781,091 A * | 7/1998 | Krone et al. | 336/220 |
| 5,889,319 A * | 3/1999 | Moller et al. | 257/691 |
| 6,057,600 A * | 5/2000 | Kitazawa et al. | 257/728 |
| 6,148,500 A * | 11/2000 | Krone et al. | 29/602.1 |
| 6,175,727 B1 * | 1/2001 | Mostov | 455/307 |
| 6,229,124 B1 | 5/2001 | Trucco | 219/605 |
| 6,696,910 B1 * | 2/2004 | Nuytkens et al. | 336/200 |
| 6,720,502 B1 * | 4/2004 | Alcoe et al. | 174/262 |
| 6,740,222 B1 * | 5/2004 | Cohn | 205/126 |

* cited by examiner

*Primary Examiner*—Stacy A. Whitmore
*Assistant Examiner*—Magid Y. Dimyan
(74) *Attorney, Agent, or Firm*—Schwegman, Lundberg, Woessner & Kluth, P.A.

(57) ABSTRACT

A series of plated through hole (PTH) vias are interconnected by traces that alternate between a top surface and a bottom surface of a dielectric board. The PTH vias in the series can be positioned to create a collinear inductive filter, a coil-type inductive filter, or a transformer. Multiple, electrically isolated series of interconnected PTH vias can be used as a multi-phase inductive filter in one embodiment. In another embodiment, multiple series of interconnected PTH vias are electrically connected by a linking portion of conductive material, resulting in a low-resistance inductive filter. Ferromagnetic material patterns can be embedded in the dielectric board to enhance the inductive characteristics of the interconnected via structures. In one embodiment, a closed-end pattern is provided with two series of interconnected vias coiling around the pattern, resulting in an embedded transformer structure. A method of producing an interconnected series of PTH vias includes providing a dielectric board having a series of holes. In some embodiments, the board includes an embedded ferromagnetic material pattern. The holes and the top and bottom surface of the dielectric board have a conductive material thereupon. Portions of the conductive material are selectively removed, resulting in the embedded inductive filter and/or transformer structure.

8 Claims, 18 Drawing Sheets

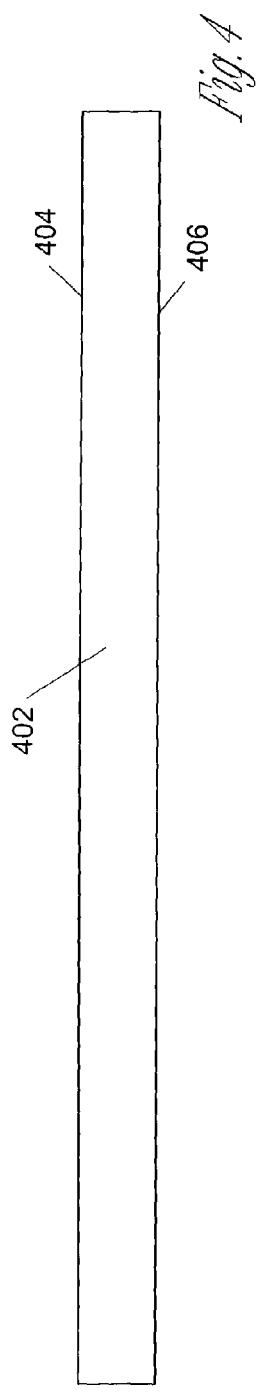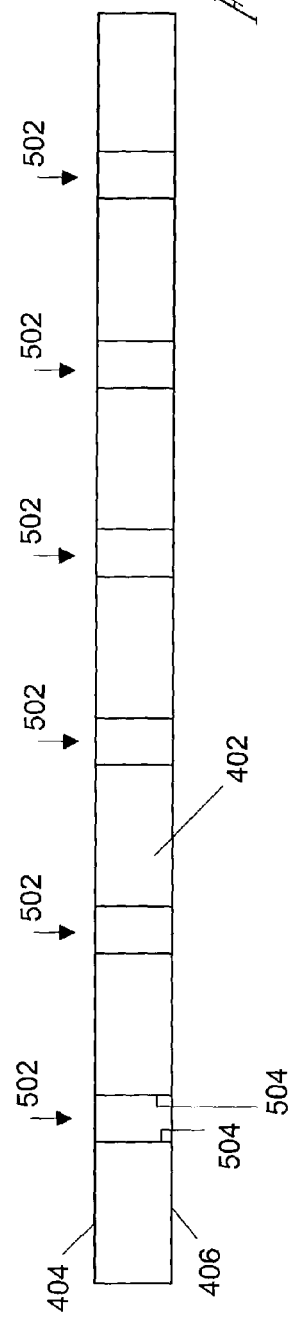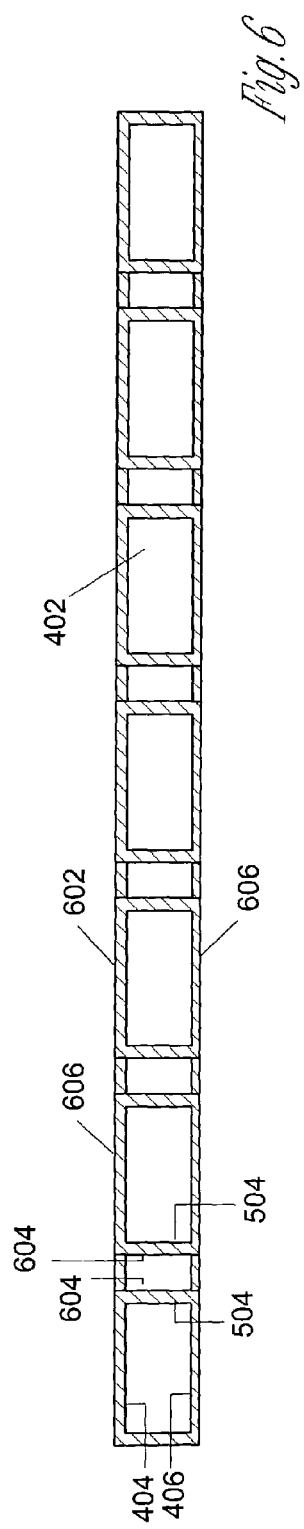

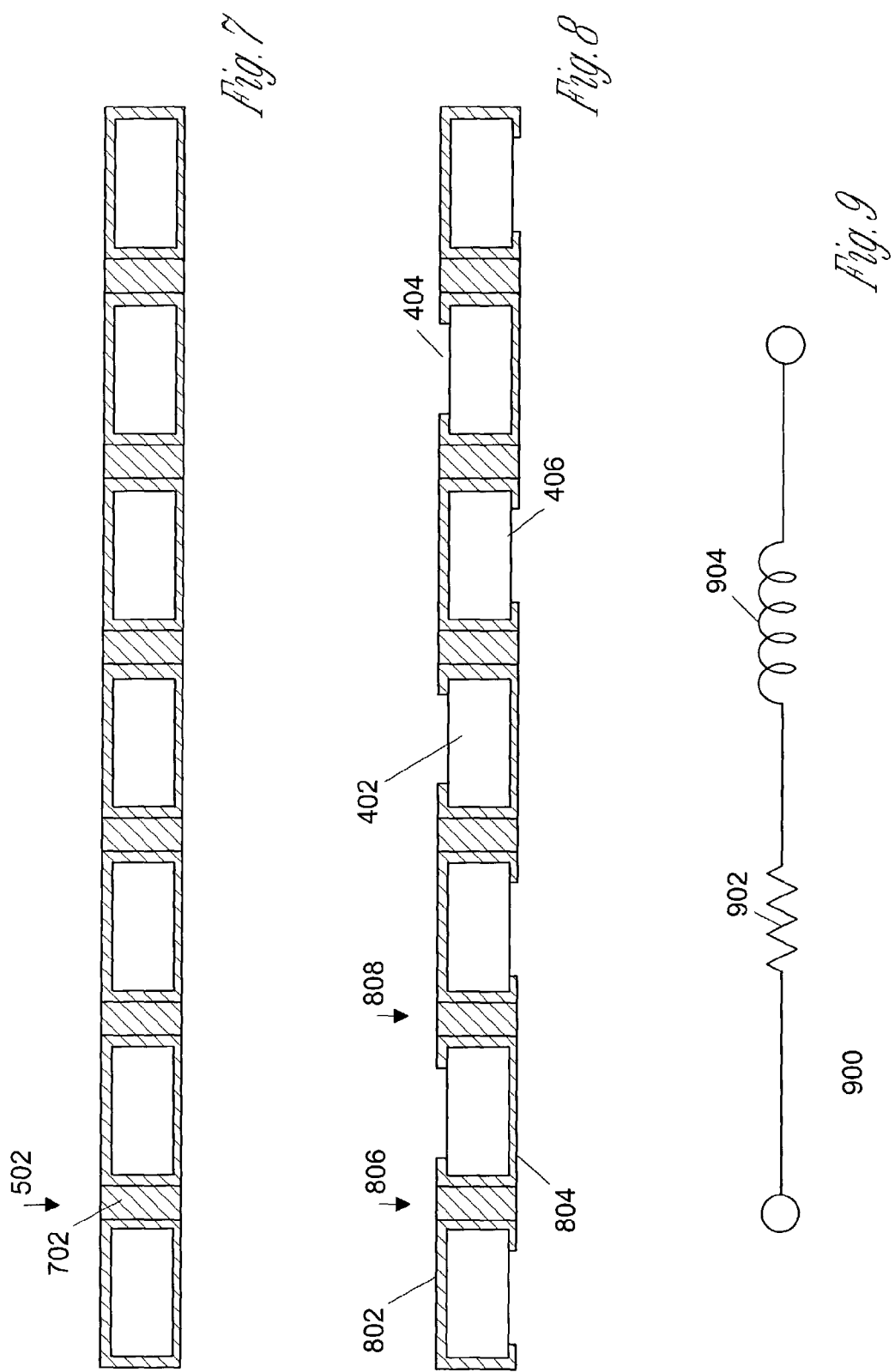

INDUCTIVE FILTERS AND METHODS OF FABRICATION THEREOF

This application is a divisional of U.S. application Ser. No. 09/473,353, filed Dec. 28, 1999, now issued as U.S. Pat. No. 6,493,861.

TECHNICAL FIELD OF THE INVENTION

The present invention relates generally to microelectronic structures and fabrication methods, and more particularly to microelectronic structures having inductive characteristics and methods of fabricating the same.

BACKGROUND OF THE INVENTION

A requirement of most electronic systems is a regulated source of direct current (DC) voltage. Whether the DC power originates with a battery or has been converted from alternating current (AC) power, a voltage regulator circuit is usually required to provide a steady DC voltage.

FIG. 1 illustrates a simple power supply circuit 100 that includes a voltage regulator. In power supply circuit 100, the voltage provided by AC voltage source 110 is increased or decreased by transformer 112 to a voltage having a magnitude that is required by the load. The transformed voltage passes through rectifier 114, which is a set of diodes in FIG. 1. The voltage is then filtered by capacitive filter 116. The resulting voltage is regulated by voltage regulator 118, which can be a discrete component circuit or an integrated circuit voltage regulator. Either way, the output voltage is filtered through inductive filter 120. The filtered voltage is then supplied to load 122, which could be, for example, an integrated circuit such as a microprocessor.

To supply voltage to an integrated circuit, transformer 112, rectifier 114, capacitive filter 116, and voltage regulator 118 are typically consolidated into a voltage regulator module (VRM), which is a discrete component that is mounted on a printed circuit (PC) board. Inductive filter 120 typically is a separate component, due to the relatively large size of the inductor.

FIG. 2 illustrates a VRM 202 and an inductive filter 204 located on a PC board 206 of a computer system in accordance with the prior art. To supply power to an integrated circuit, electrical current first travels from the VRM 202 through the inductive filter 204. The current then travels through traces (not shown) in PC board 206, and up through socket 208 to pins 210 of an integrated circuit (IC) package 212 The current continues along traces (not shown) in IC package 212 to connections 214. Connections 214 make electrical contact with pads (not shown) on the integrated circuit 216.

The scale and/or location of pins 210 on an IC package 212 may be different from the scale and/or location of pin holes on the socket 208. Thus, in some systems, an interposer (not shown) exists between the IC package 212 and the socket 208. The interposer essentially is a small printed circuit board that provides a dimensional interface between the IC package pins 210 and the pin holes of the socket 208. When an interposer is present, the supplied current must also travel through the interposer to reach the integrated circuit.

A voltage drop occurs between VRM 202 and integrated circuit 216, due to losses along the path between VRM 202 and integrated circuit 216. All other things being equal, the farther the distance between VRM 202 and integrated circuit 216, the larger the voltage drop. At relatively low voltages, this voltage drop is a tolerable effect that is compensated for by providing a VRM that supplies a higher voltage than is actually needed by the integrated circuit. A negative side effect of this strategy, however, is that the VRM may need to be larger than necessary, and power is inefficiently consumed.

Technological advancements in integrated circuit technologies are driving frequency requirements higher, and driving voltages and voltage margins lower. Therefore, it is desirable to reduce the inefficient power consumption caused by the voltage drop between the VRM and the integrated circuit. This reduction in voltage drop can be achieved by moving the VRM and inductive filter as close as possible to the integrated circuit. However, the proximity of the VRM and inductive filter to the integrated circuit is limited by the fact that the VRM and inductive filter must be located on the PC board in prior art systems.

For the reasons stated above and for other reasons stated below, which will become apparent to those skilled in the art upon reading and understanding the present specification, there is a need in the art for a circuit configuration enabling a VRM and inductive filter to be placed closer to the integrated circuit than is possible in prior art systems.

SUMMARY OF THE INVENTION

In one embodiment, a method for forming an interconnected series of plated through hole (PTH) vias begins by providing a dielectric board with a series of PTH vias formed therein. The PTH vias are electrically connected on a top surface and a bottom surface of the dielectric board by a conductive material. Portions of the conductive material are then selectively removed so that adjacent PTH vias are electrically connected by a trace of the conductive material on either the top surface or the bottom surface. The adjacent PTH vias in the series alternate between being electrically connected by a trace on the top surface or electrically connected by a trace on the bottom surface.

In another embodiment, a series of interconnected PTH vias forms an inductive filter that includes a dielectric board having a top surface and a bottom surface, and a series of PTH vias formed in the dielectric board. Conductive material traces exist on the top surface and the bottom surface that electrically connect the PTH vias. Adjacent PTH vias are electrically connected by a trace on either the top surface or the bottom surface, and the adjacent PTH vias in the series alternate between being electrically connected by a trace on the top surface or electrically connected by a trace on the bottom surface.

In yet another embodiment, two series of interconnected PTH vias forms a transformer that includes a dielectric board having a top surface and a bottom surface. A ferromagnetic material pattern forming a core is embedded in the dielectric board, and has a closed-end shape. A first series of interconnected PTH vias is formed in the dielectric board. The PTH vias in the first series and traces of conductive material on the top surface and bottom surface form a first coil-like structure that winds around the core. A second series of interconnected PTH vias is also formed in the dielectric board. The PTH vias in the second series and additional traces of conductive material on the top surface and bottom surface form a second coil-like structure that winds around the core. The first coil-like structure, the second coil-like structure, and the coil form the transformer.

One embodiment can be, an integrated circuit package includes a package having a first series of PTH vias that provide electrical connections between a top surface of the package and a bottom surface of the package. The PTH vias in the first series are electrically connected by conductive material traces on the top surface and the bottom surface, and adjacent PTH vias in the first series alternate between being electrically connected by a trace on the top surface or electrically connected by a trace on the bottom surface. The integrated circuit package also includes an integrated circuit located on the top surface of the package. The integrated circuit contains a circuit which is electrically connected to a PTH via of the first series.

An interposer designed to provide a dimensional interface between an integrated circuit package and a printed circuit board includes a first series of PTH vias that provide electrical connections between a top surface of the package and a bottom surface of the package is provided in one embodiment. The interposer also includes conductive material traces on the top surface and the bottom surface that electrically connect the PTH vias in the first series, where adjacent PTH vias in the first series alternate between being electrically connected by a trace on the top surface or electrically connected by a trace on the bottom surface.

A computer system embodiment is positioned on a printed circuit board includes a bus, a memory coupled to the bus, and an integrated circuit package coupled to the bus. The integrated circuit package includes a package having a first series of PTH vias that provide electrical connections between a top surface of the package and a bottom surface of the package. The PTH vias in the first series are electrically connected by conductive material traces on the top surface and the bottom surface, and adjacent PTH vias in the first series alternate between being electrically connected by a trace on the top surface or electrically connected by a trace on the bottom surface. The integrated circuit package also includes a microprocessor located on the top surface of the package, the microprocessor containing a circuit which is electrically connected to a PTH via of the series of PTH vias.

BRIEF DESCRIPTION OF THE DRAWINGS

FIGS. 4–8 are schematic cross sections illustrating various stages of fabricating one or more series of interconnected PTH vias in accordance with one embodiment of the present invention;

FIG. 9 illustrates an electrical circuit that simulates the electrical characteristics of the inductive filter illustrated in FIG. 8;

DETAILED DESCRIPTION OF THE INVENTION

Figure 2:
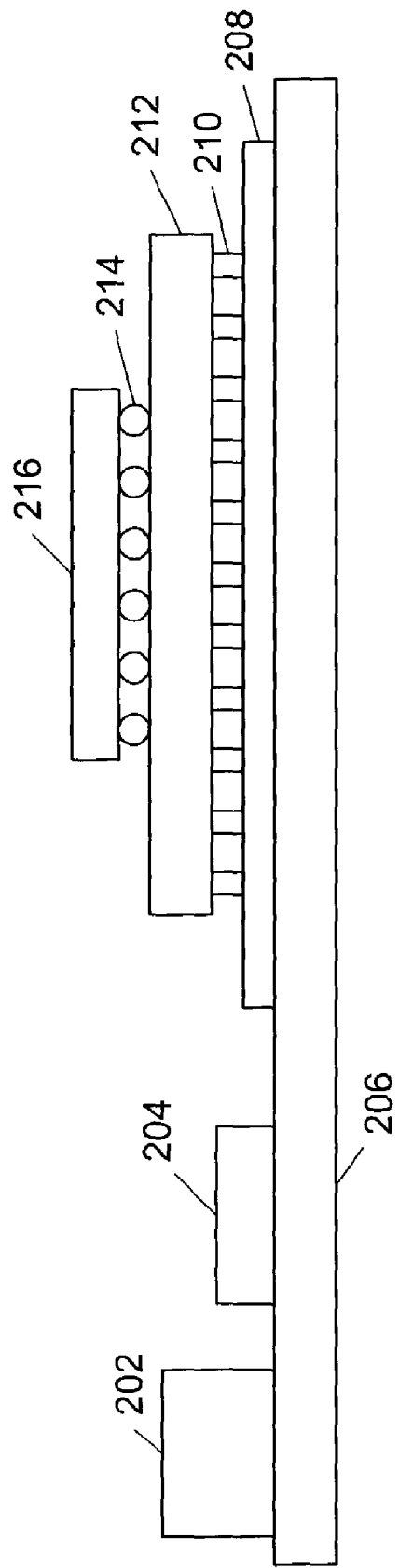
FIG. 2 illustrates a voltage regulator module and an inductive filter located on a mother board of a computer system in accordance with the prior art.

An apparatus of the present invention includes one or more series of interconnected plated through hole (PTH) vias that function as an inductive filter or transformer. These series of PTH vias are embedded in a semiconductor package or interposer. When serving the function of an embedded inductive filter, the interconnected PTH via structure enables the discrete inductive filter (e.g., filter 204, FIG. 2) to be replaced or substantially reduced in size. By eliminating or reducing the size of the inductive filter, it becomes possible to place a voltage regulator module (VRM) on an integrated circuit (IC) package or interposer. The closer proximity of the VRM to the integrated circuit results in less voltage drop and a much more efficient power delivery system.

Figure 1:
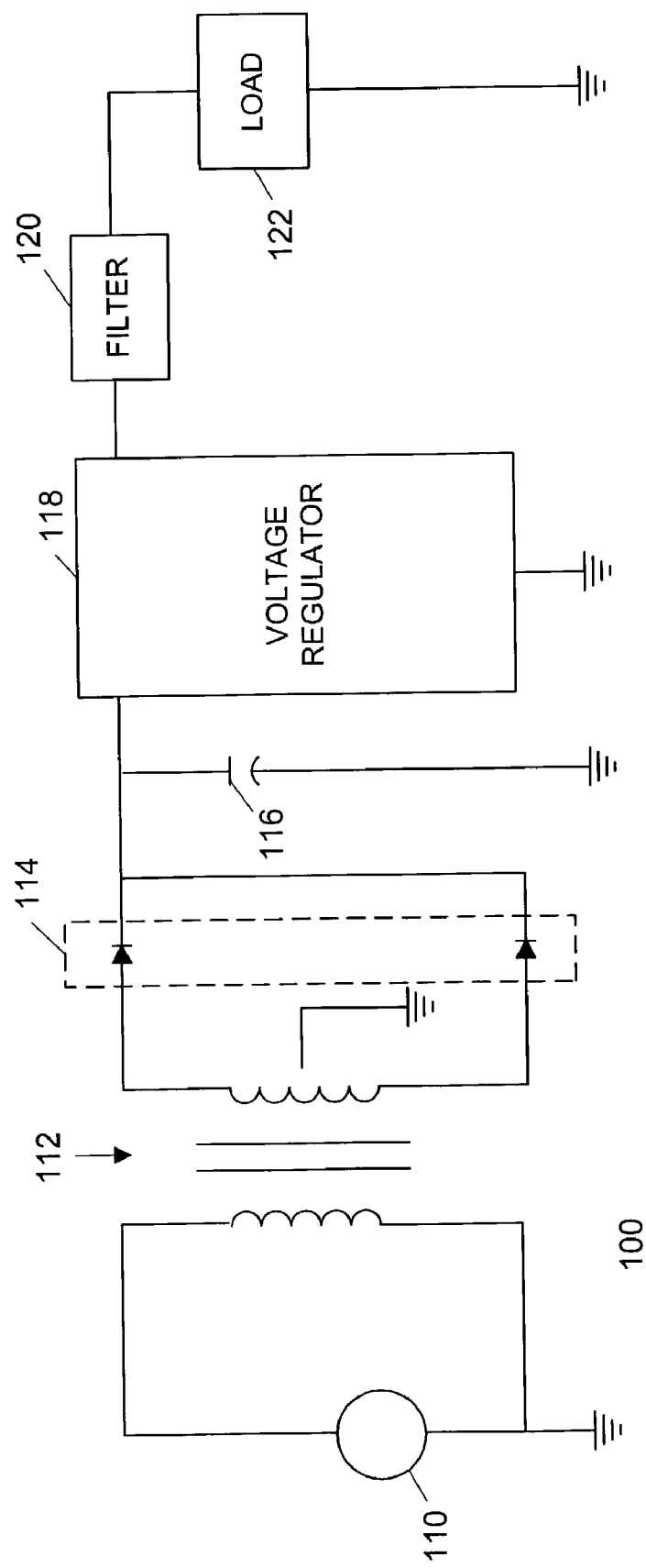
FIG. 1 illustrates a simple power supply circuit in accordance with the prior art.

When serving the function of an embedded transformer, the interconnected PTH via structure enables the transformer portion (e.g., transformer 112, FIG. 1) of the VRM to be removed from the VRM, thus reducing the size of the VRM. This also facilitates placement of the VRM onto an interposer and/or IC package.

Figure 31:
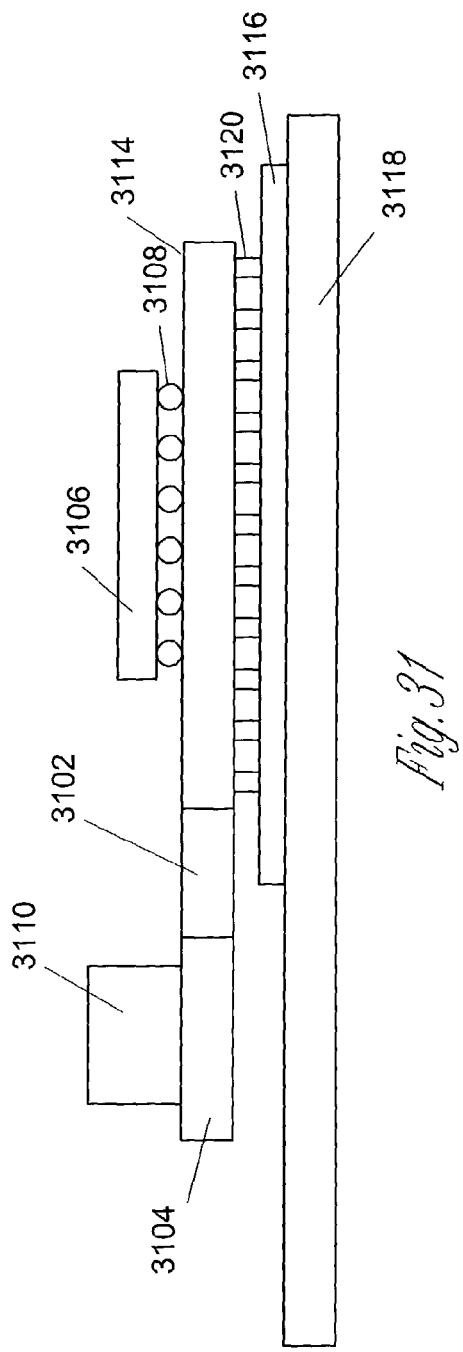
FIG. 31 illustrates the incorporation of one or more embedded series of interconnected PTH vias in an integrated circuit package in accordance with one embodiment of the present invention.
Figure 32:
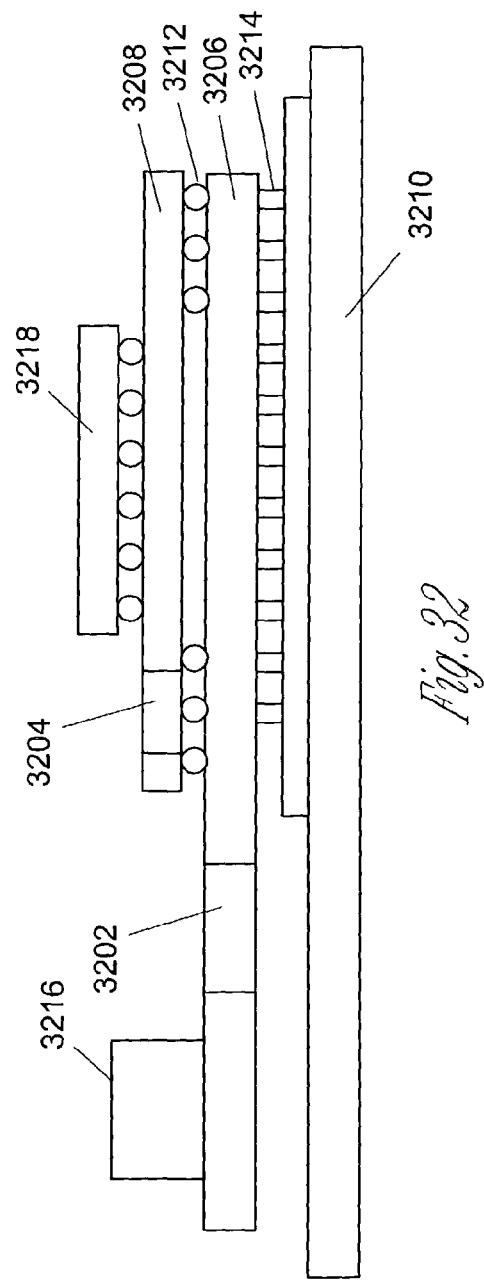
FIG. 32 illustrates the incorporation of one or more embedded series of interconnected PTH vias in an interposer and/or integrated circuit package in accordance with one embodiment of the present invention.
Figure 33:
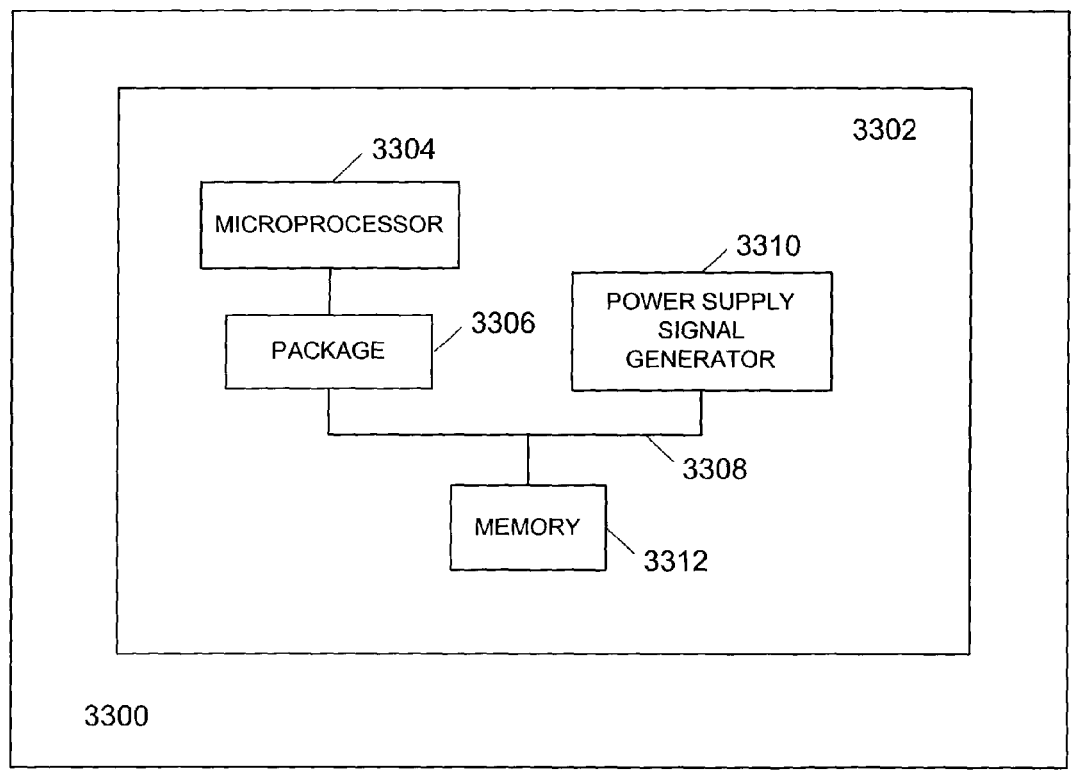
FIG. 33 illustrates a general purpose computer system in accordance with one embodiment of the present invention.

FIGS. 3–30 illustrate the fabrication of various embodiments of interconnected series of PTH vias. FIGS. 31 and 32 illustrate the incorporation of these PTH via structures in an IC package and interposer. Finally, FIG. 33 illustrates a general purpose computer system that includes one or more series of interconnected PTH vias.

Figure 3:
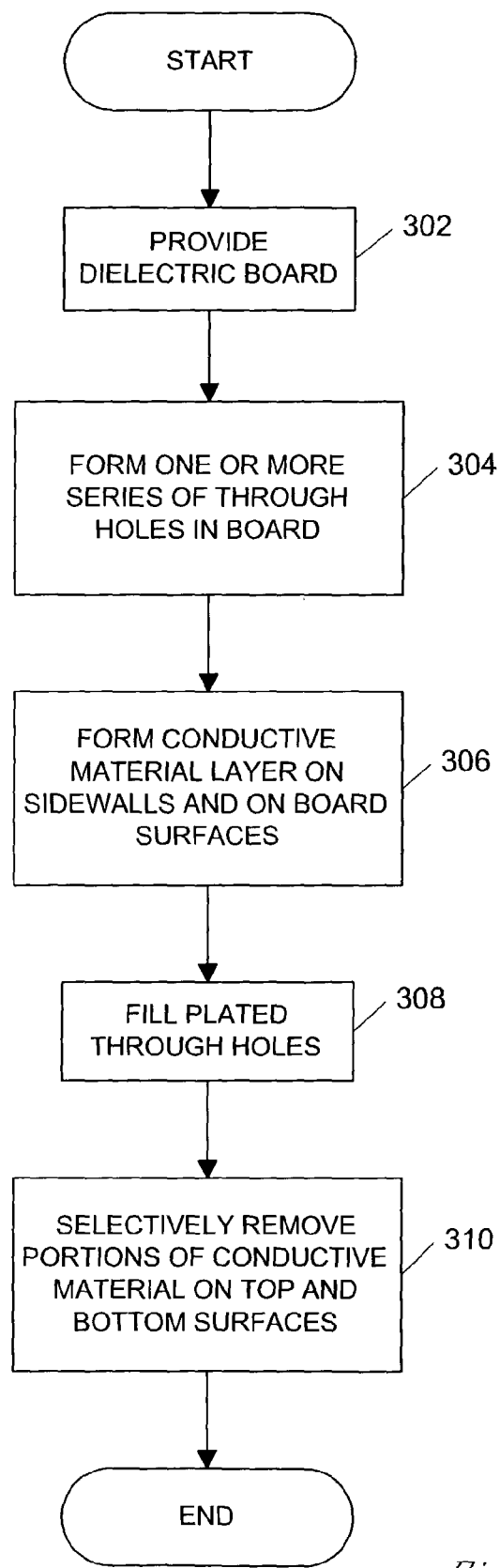
FIG. 3 illustrates a flowchart of a method for fabricating one or more series of interconnected plated through hole (PTH) vias in accordance with one embodiment of the present invention.

FIG. 3 illustrates a flowchart of a method for fabricating one or more series of interconnected PTH vias in accordance with one embodiment of the present invention. In order to best describe the method of fabricating, FIG. 3 should be viewed in conjunction with FIGS. 4–8, which are schematic cross sections illustrating various stages of fabricating one or more series of interconnected PTH vias in accordance with one embodiment of the present invention.

The method begins, in block 302, by providing a dielectric board 402 (FIG. 4), which has a top surface 404 and a bottom surface 406. In one embodiment, dielectric board 402 is an organic substrate, such as an epoxy material. For example, standard printed circuit board materials such as FR-4 epoxy-glass, polymide-glass, benzocyclobutene, Teflon, other epoxy resins, or the like could be used in various embodiments. In alternate embodiments, dielectric board 402 could consist of an inorganic substance, such as ceramic, for example.

Both the top and bottom surfaces 404, 406 of dielectric board 402 are substantially horizontal. In various embodiments, the thickness of dielectric board 402 is within a range of 600–1000 microns, with it being approximately 800 microns in one embodiment. Dielectric board 402 could be thicker or thinner than this range in other embodiments.

Referring back to FIG. 3, in block 304, one or more series of holes 502 (FIG. 5) are formed through dielectric board 402. In various embodiments, the diameter of each hole 502 is within a range of 50–150 microns, with it being approximately 100 microns in one embodiment. This diameter could be larger or smaller than this range in other embodiments.

As will be described in more detail below, the series of holes 502 could be formed in a substantially collinear manner in one embodiment. This orientation will be described in more detail in conjunction with FIG. 10, and can be used to provide a collinear inductive filter. In other embodiments, each hole in the series could be offset from the preceding hole. For example, odd numbered holes in the series could be substantially collinear with each other. Even numbered holes could also be substantially collinear with each other, but they could be formed along a line that is offset from, but substantially parallel to the line along which the odd number holes are formed. This orientation will be described in more detail in conjunction with FIG. 13, and can be used to provide a coil-type inductive filter.

In addition, although only one series of holes 502 is shown in FIG. 5, multiple series of holes could be provided in various alternate embodiments. For example, as will be described in conjunction with FIGS. 11, 14, 17, and 18, multiple series of PTH vias could be used to provide a multi-phase inductive filter. Alternatively, as will be described in conjunction with FIG. 29, multiple series of holes could be used to provide an embedded transformer.

Holes 502 are defined by sidewalls 504, which are substantially vertical, or orthogonal, to the top and bottom surfaces 404, 406 of dielectric board 402. In one embodiment, holes 502 are mechanically drilled, although holes 502 may also be punched or drilled using a laser or other drilling technologies in various other embodiments. If dielectric board 402 is an inorganic substance, such as ceramic, other hole formation techniques known to those of skill in the art would be used.

Referring back to FIG. 3, in block 306, a conductive material layer 602 (FIG. 6) is formed on the sidewalls 504 of holes 502, and on top and bottom surfaces 404, 406 of dielectric board 402. In one embodiment, conductive layer 602 is formed using electroplating techniques, although other techniques could be used in other embodiments. For example, rather than providing dielectric board without a conductive material in block 302, a clad laminate, such as a copper-clad laminate, could be provided, making block 306 unnecessary. In one embodiment, conductive layer 602 is a copper layer, although other conductive metals such as tin, lead, nickel, gold, and palladium, or other materials could be used in other embodiments.

PTH vias are defined by portions 604 of the conductive layer 602 that are disposed on sidewalls 504. Other portions 606 of the conductive layer are horizontally-disposed on the top and bottom surfaces 404, 406 of dielectric board 402, resulting in an electrical connection between each PTH via 604 and the horizontally disposed portions 606 of the conductive layer. In various embodiments, the thickness of conductive layer 602 is within a range of 5–15 microns, with it being approximately 10 microns in one embodiment. Conductive layer 602 could be thicker or thinner than that range in other embodiments.

Referring back to FIG. 3, in block 308, holes 502 are substantially filled with a conductive material 702 (FIG. 7). Holes 502 could be screen-filled, for example, using a paste of conductive material. Conductive material 702 could be copper, for example, although other conductive materials could be used in various embodiments. In alternate embodiments, holes 502 could be filled with a non-conductive material such as an epoxy fill material, although other non-conductive materials also could be used in other embodiments.

In block 310, portions of the conductive material layer on the top and bottom surfaces 404, 406 of the dielectric board 402 are selectively removed, leaving conductive traces 802, 804 (FIG. 8) on the top and bottom surfaces 404, 406. Removal of the portions of conductive material could be performed, for example, using a common subtractive technology such as a photo or laser imaging and etching process. Other subtractive technologies could be used in other embodiments. In still other embodiments, additive technology could be used to deposit conductive traces 802. For example, rather than plating and etching top and bottom surfaces 404, 406, traces 802 could be selectively screened or stenciled using a conductive paste. After creating conductive traces 802, the method ends.

The flow of current along the interconnected via structure can be traced from the left side of the structure to the right as follows. First, the current flows along a first trace 802 on the top surface 404 of the dielectric board 402. The current then flows down through PTH via 806, and along a second trace 804 on the bottom surface 406 of the dielectric board 402. The current then flows up through PTH via 808, and so on, for the length of the interconnected PTH via structure.

The nonlinear path of the current is similar to the path experienced in an inductor, and thus the PTH via structure shown in FIG. 8 emulates the electrical properties of an inductor. FIG. 9 illustrates an electrical circuit that simulates the electrical characteristics of the inductive filter illustrated in FIG. 8. Circuit 900 includes a resistor 902 in series with an inductor 904.

The value of resistor 902 depends on the conductive characteristics of the conductive material, the cross-sectional area and length of traces 802, 804, the diameter and depth of PTH vias 806, 808, and the number of PTH vias 806, 808 in the structure. Similarly, the value of inductor 904 depends on the number and proximity of PTH vias 806, 808 with respect to each other, and the magnetic permeability of dielectric board 402.

Although six PTH vias 806, 808 are shown in FIG. 8, the number of PTH vias 806, 808 in the inductive filter structure can be varied during the design process to adjust the resistance and inductance values. In addition, although traces 802, 804 and PTH via sizes and locations are illustrated with specific relative dimensions, the relative dimensions and locations of the PTH vias and traces, and the magnetic permeability of dielectric board 402 can also be varied during the design process to adjust the resistance and inductance values.

Using the structure shown in FIG. 8, current can be filtered in roughly the same manner as it would be using a discrete inductive filter. Thus, the embedded structure of the present invention can be used in place of a discrete inductive filter, for example, to filter the output of a VRM.

Figure 10:
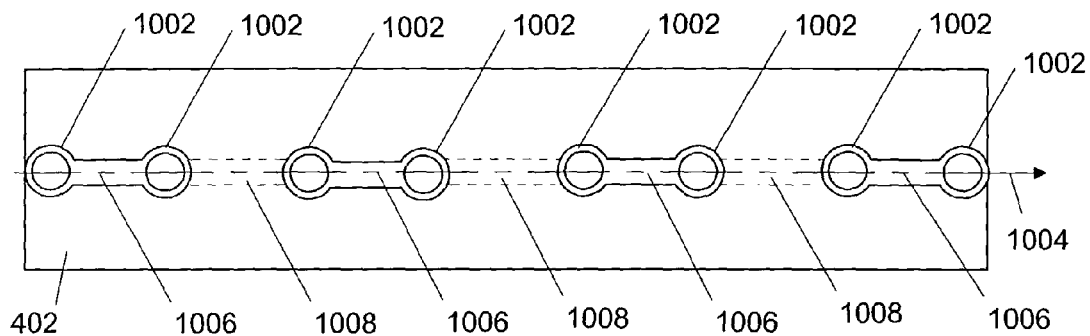
FIG. 10 illustrates a top view of a single-phase, collinear inductive filter in accordance with one embodiment of the present invention.

FIG. 10 illustrates a top view of a single-phase, collinear inductive filter in accordance with one embodiment of the present invention. Filled PTH vias 1002 are arranged in a substantially collinear manner along line 1004. In alternate embodiments, PTH vias 1002 could be arranged in a non-collinear manner. Sets of PTH vias are electrically connected on the top surface of dielectric board 402 by top traces 1006. The PTH vias are also electrically connected on the bottom surface of dielectric board 402 by bottom traces 1008, shown in FIG. 10 as dashed lines. Thus, along the top surface and the bottom surface, adjacent PTH vias alternate between being electrically connected and electrically isolated. If two adjacent PTH vias are electrically connected on one surface, the same two adjacent PTH vias are electrically isolated on the bottom surface.

Figure 11:
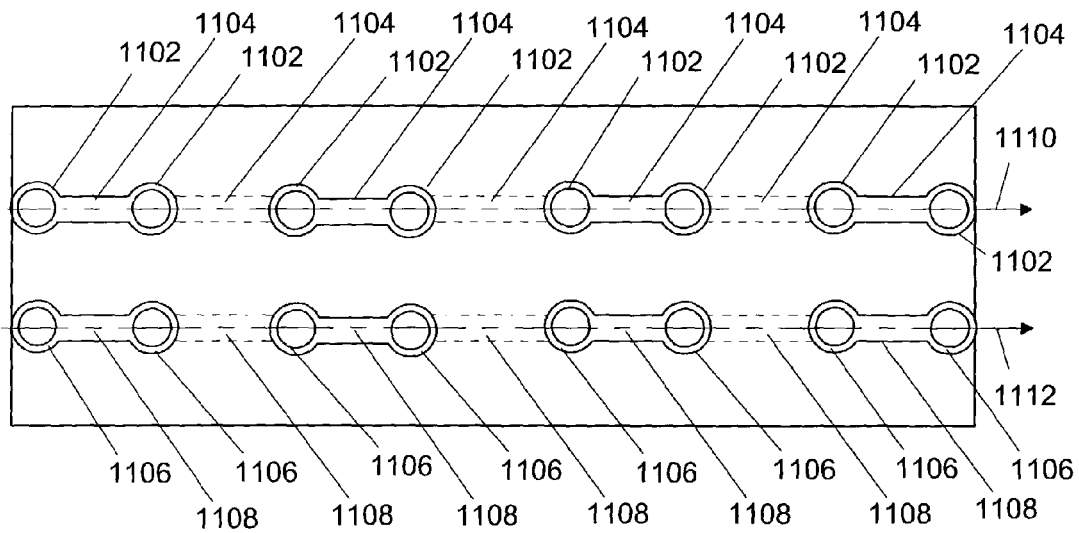
FIG. 11 illustrates a top view of a multi-phase, collinear inductive filter in accordance with one embodiment of the present invention.

The interconnected PTH structure, by itself, provides a single-phase inductive filter. In order to provide a multi-phase inductive filter, multiple via structures could be used. FIG. 11 illustrates a top view of a multi-phase, collinear inductive filter in accordance with one embodiment of the present invention. In the embodiment shown, a two-phase filter is provided by supplying two series of interconnected PTH vias. The first series includes PTH vias 1102, that are electrically connected by traces 1104 on the top and bottom surfaces of the dielectric board 402. The second series includes PTH vias 1106 that are electrically connected by traces 1108 on the top and bottom surfaces.

The first series and the second series are electrically isolated from each other. Thus, during the selective removal block 310 of the flowchart of FIG. 3, all portions of the conductive material existing between the two series are removed from the surfaces of the dielectric board. The electrical isolation of each series enables each series to be used to filter a different phase of the supplied current.

Each PTH via in a series could be collinear with the other PTH vias in the series. For example, FIG. 11 illustrates that PTH vias 1102 are formed along line 1110, and PTH vias 1106 are formed along line 1112. In alternate embodiments, the PTH vias in a series could be non-collinear. Lines 1110 and 1112 could be substantially parallel to each other, although it is not essential that this be the case. In alternate embodiments, lines 1110 and 1112 could be arranged at various angles to each other.

Figure 12:
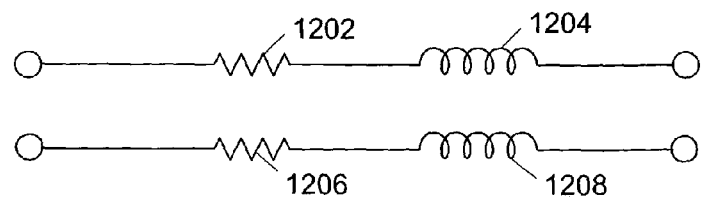
FIG. 12 illustrates an electrical circuit that simulates the electrical characteristics of the inductive filter illustrated in FIG. 11.

FIG. 12 illustrates an electrical circuit that simulates the electrical characteristics of the inductive filter illustrated in FIG. 11. The circuit shown in FIG. 12 is similar to that illustrated in FIG. 9, except that a first series resistor 1202 and inductor 1204 is in parallel with a second series resistor 1206 and inductor 1208. When used as a multi-phase filter, each resistor/inductor series can be used to carry a different phase of current. Although only two series are shown in FIGS. 11 and 12, it would be obvious to one of skill in the art based on the description herein, that three or more series could be used to provide filtering for three or more phases.

As described previously, the PTH vias in a series of vias could be arranged in a collinear or non-collinear manner. In one embodiment, arrangement of the PTH vias in a non-collinear manner results in a coil-type inductive filter.

Figure 13:
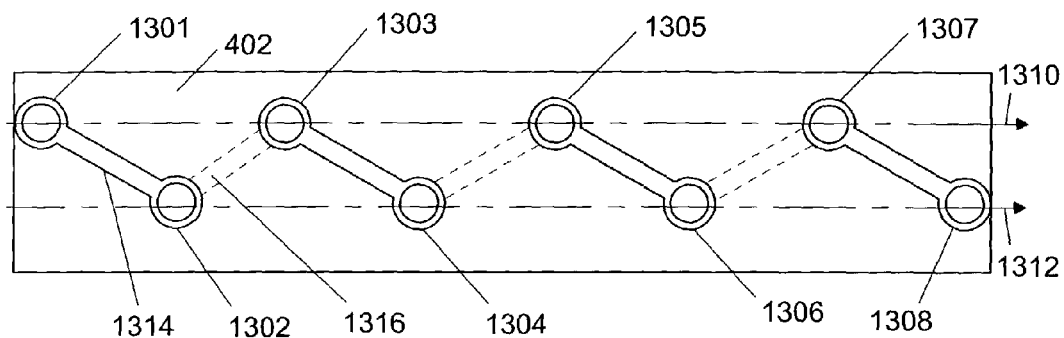
FIG. 13 illustrates a top view of a single-phase, coil-type inductive filter in accordance with one embodiment of the present invention.

FIG. 13 illustrates a top view of a single-phase, coil-type inductive filter in accordance with one embodiment of the present invention. The PTH vias 1301, 1302, 1303, 1304, 1305, 1306, 1307, and 1308 in the series are arranged along two, substantially parallel lines 1310, 1312, which are offset from one another. The odd numbered PTH vias 1301, 1303, 1305 and 1307 are substantially collinear with each other along line 1310, and the even numbered PTH vias 1302, 1304, 1306, and 1308 are substantially collinear with each other along line 1312.

The PTH vias 1301–1308 are electrically connected with each other by traces 1314, 1316 on the top and bottom surfaces, respectively, of the dielectric board 402. Moving from left to right, electrical current flowing through the series of vias would flow along a top trace 1314, down through a PTH via 1302, along a bottom trace 1316, up through the next PTH via 1303, and so on through the series. The current, therefore, follows a roughly spiral-shaped path. This path resembles a coil, and thus the structure illustrated in FIG. 13 emulates a coil-type inductive filter.

An electrical circuit modeling the electrical characteristics of the structure in FIG. 13 was shown and described in conjunction with FIG. 9. Variables that affect the values of resistor 902 and inductor 904 are those listed in conjunction with FIG. 9, but also include the number, tightness, and diameter of "windings" in the PTH via structure, where a winding is comprised of two adjacent PTH vias in the series and a top and bottom trace connected to those vias. For example, three and a half windings are illustrated in the PTH via structure of FIG. 13. In alternate embodiments, more or fewer windings could be included in the PTH via structure. In addition, the relative spacing of the PTH vias with respect to each other could be altered to adjust the electrical characteristics of the inductor.

Figure 14:
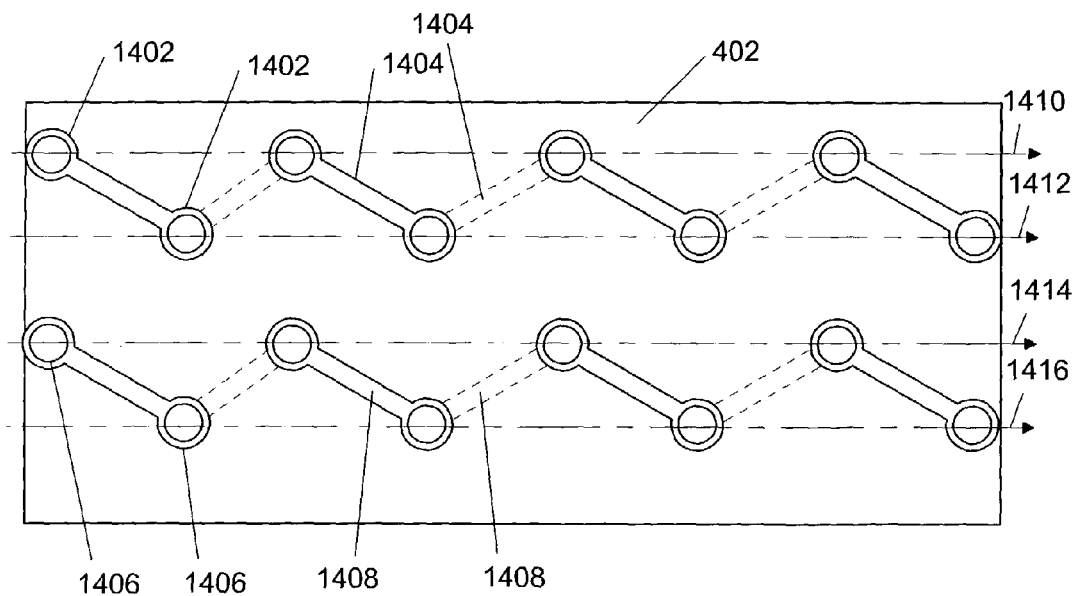
FIG. 14 illustrates a top view of a multi-phase, coil-type inductive filter in accordance with one embodiment of the present invention.

FIG. 14 illustrates a top view of a multi-phase, coil-type inductive filter in accordance with one embodiment of the present invention. In the embodiment shown, a two-phase filter is provided by supplying two series of interconnected PTH vias. The first series includes PTH vias 1402, that are electrically connected by traces 1404 on the top and bottom surface of the dielectric board 402. The second series includes PTH vias 1406 that are electrically connected by traces 1408 on the top and bottom surface. The first series and the second series are electrically isolated from each other, enabling each series to provide an inductive filter to a different phase of the supplied current.

PTH vias 1402 are formed along lines 1410, 1412, and PTH vias 1406 are formed along lines 1414, 1416. Accordingly, each series provides a coil-type inductive filter. The set of lines 1410, 1412 could be substantially parallel to the set of lines 1414, 1416, although it is not essential that this be the case. In alternate embodiments, line set 1410, 1412 and line set 1414, 1416 could be arranged at various angles to each other.

In order to reduce the resistance of the PTH via structure (e.g., the resistance modeled by resistor 902, FIG. 9), it is possible to effectively increase the cross-sectional area of traces and PTH vias in various embodiments of the present invention. This can be accomplished by electrically connecting multiple series of interconnected PTH vias.

Figure 15:
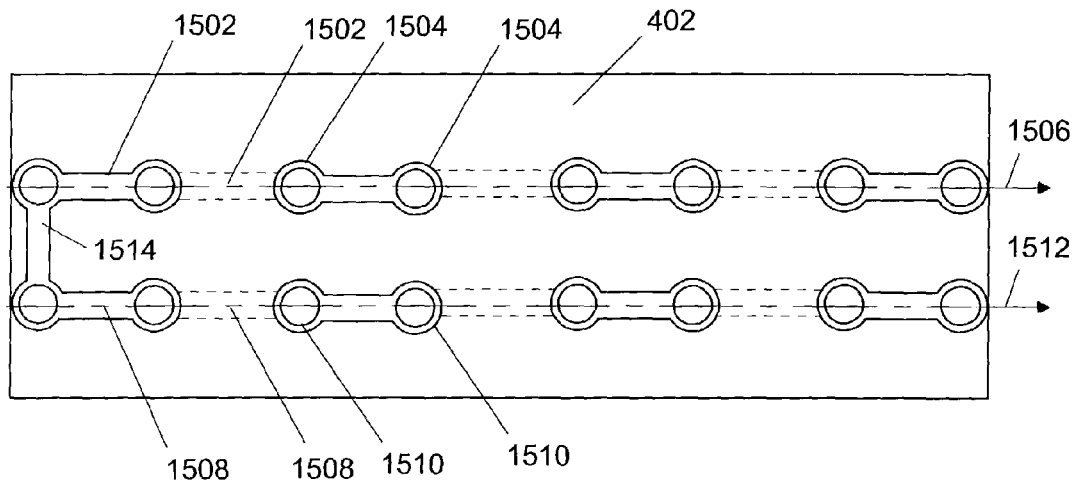
FIG. 15 illustrates a top view of a low-resistance, single-phase, collinear inductive filter in accordance with one embodiment of the present invention.

FIG. 15 illustrates a top view of a low-resistance, single-phase, collinear inductive filter in accordance with one embodiment of the present invention. Two collinear interconnected PTH via structures are shown, with one structure being defined by traces 1502 and PTH vias 1504 along line 1506, and the second structure being defined by traces 1508 and PTH vias 1510 along line 1512. Lines 1506 and 1512 could be, but are not necessarily, substantially parallel.

These PTH via structures are interconnected by a linking portion 1514 of conductive material that electrically connects at least one PTH via in each series. This results in a set of multiple interconnected PTH via series. Linking portion 1514 could be located on the top surface or the bottom surface of dielectric board 402.

Unlike the multiple series of vias shown in FIG. 11, where the first series and the second series are electrically isolated from each other, the series defined by PTH vias 1504 is electrically connected to the series defined by PTH vias 1510. Thus, during the selective removal block 310 of the flowchart of FIG. 3, all portions of the conductive material existing between the two series are removed from the surfaces of the dielectric board, except for the linking portion 1514. Because the series are not electrically isolated, they provide an inductive filter to only a single phase of supplied current.

By allowing the current to travel in parallel along two series of interconnected PTH vias, the cross-sectional area of traces and PTH vias is effectively doubled. This larger cross-sectional area provides less resistance, and thus the value of resistor 902 (FIG. 9) is essentially reduced. Although only two series of interconnected PTH vias are shown to be connected by linking portion 1514 in FIG. 15, more series of interconnected PTH vias could be electrically connected by additional linking portions in other embodiments, thus reducing the effective resistance even further.

Figure 16:
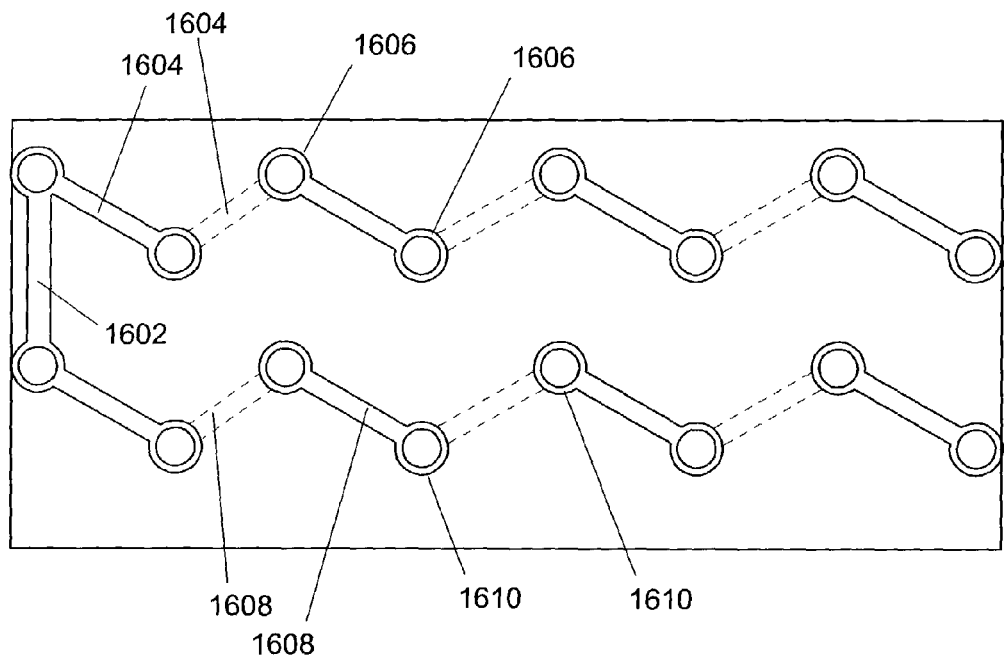
FIG. 16 illustrates a top view of a low-resistance, single-phase, coil-type inductive filter in accordance with one embodiment of the present invention.

FIG. 16 illustrates a top view of a low-resistance, single-phase, coil-type inductive filter in accordance with one embodiment of the present invention. The principle behind the structure shown in FIG. 16 is the same as that shown in FIG. 15, except that two coil-type inductive structures are electrically connected by linking portion 1602. The first inductive structure is defined by traces 1604 and PTH vias 1606, and the second structure is defined by traces 1608 and PTH vias 1610. As with the structure described in conjunction with FIG. 15, more series of PTH vias could be electrically connected by additional linking portions in other embodiments in order to reduce the effective resistance of the inductive filter.

Figure 17:
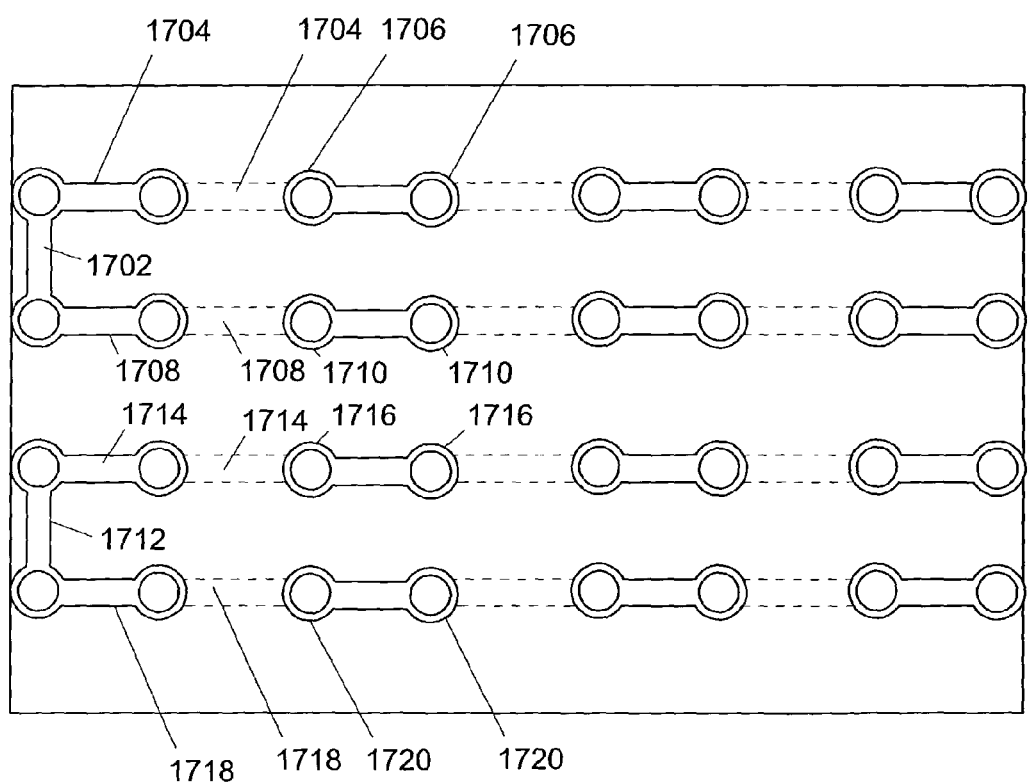
FIG. 17 illustrates a top view of a low-resistance, multi-phase, collinear inductive filter in accordance with one embodiment of the present invention.

The low-resistance structures illustrated in FIGS. 15 and 16 could also be used in multiphase applications. FIG. 17 illustrates a top view of a low-resistance, multi-phase, collinear inductive filter in accordance with one embodiment of the present invention. The filter consists of two sets of series of interconnected PTH vias. Each set is a subset of all the series of interconnected PTH vias, and each set is electrically isolated from the other sets. The first set is defined by linking portion 1702, a first series of interconnected PTH vias consisting of traces 1704 and PTH vias 1706, and a second series of interconnected PTH vias consisting of traces 1708 and PTH vias 1710. The second set, which is electrically isolated from the first set, is defined by linking portion 1712, a third series of interconnected PTH vias consisting of traces 1714 and PTH vias 1716, and a fourth series of interconnected PTH vias consisting of traces 1718 and PTH vias 1720.

A first phase of current could be carried by the first set, and a second phase could be carried by the second set. This is similar to the multi-phase structure shown in FIG. 11, except that each phase is carried by a PTH structure having a reduced resistance. In alternate embodiments, more series of interconnected vias could be included within each set, and more sets could be provided to carry additional phases of current.

Figure 18:
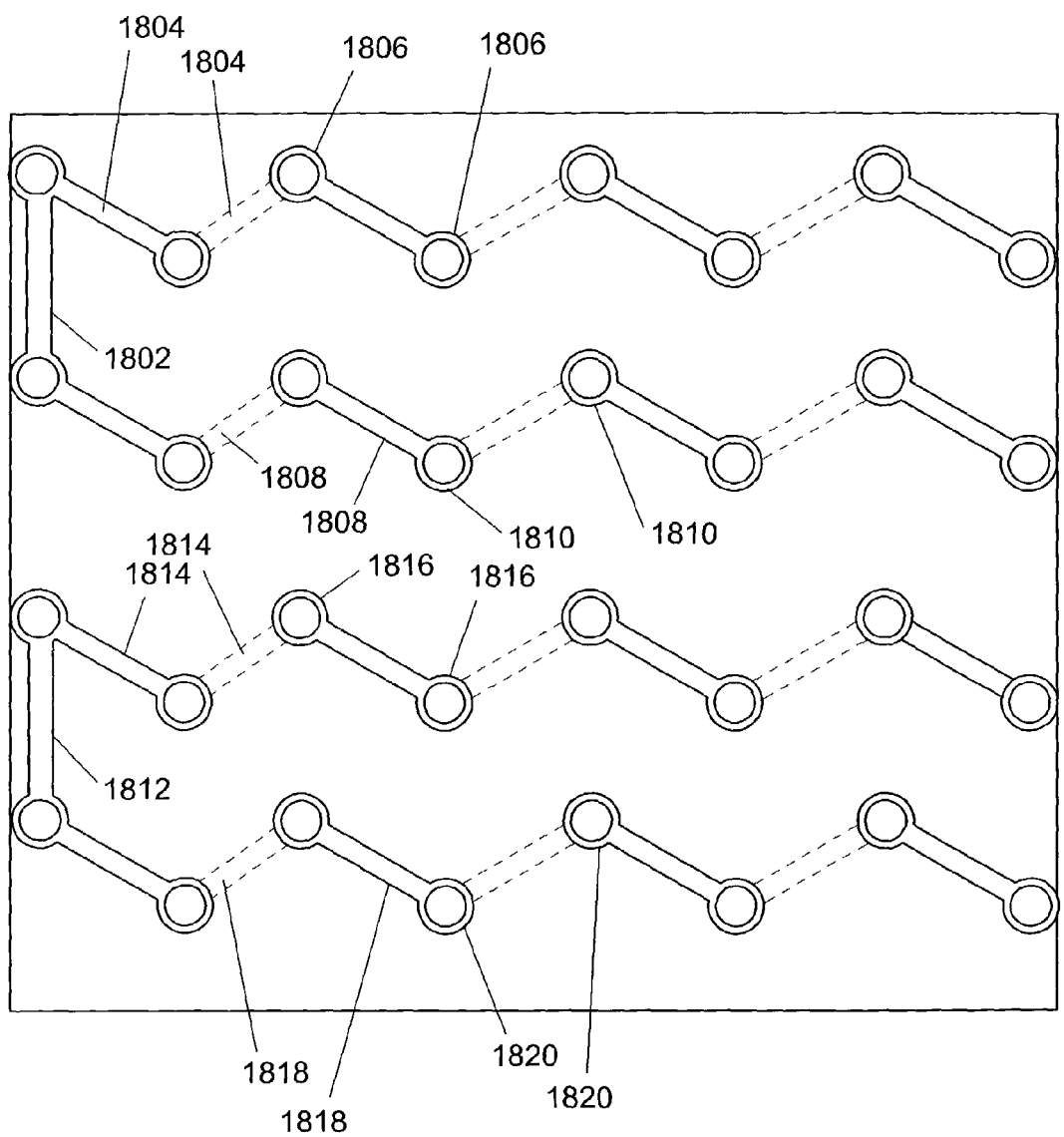
FIG. 18 illustrates a top view of a low-resistance, multi-phase, coil-type inductive filter in accordance with one embodiment of the present invention.

The multi-phase, low-resistance approach also could apply to the coil-type via structures. FIG. 18 illustrates a top view of a low-resistance, multi-phase, coil-type inductive filter in accordance with one embodiment of the present invention. The filter consists of two sets of series of interconnected PTH vias. The first set is defined by linking portion 1802, a first series of interconnected PTH vias consisting of traces 1804 and PTH vias 1806, and a second series of interconnected PTH vias consisting of traces 1808 and PTH vias 1810. The second set, which is electrically isolated from the first set, is defined by linking portion 1812, a third series of interconnected PTH vias consisting of traces 1814 and PTH vias 1816, and a fourth series of interconnected PTH vias consisting of traces 1818 and PTH vias 1820.

As with the structure illustrated in FIG. 17, a first phase of current could be carried by the first set, and a second phase could be carried by the second set. This is similar to the multiphase structure shown in FIG. 14, except that each phase is carried by a PTH structure having a reduced resistance. In alternate embodiments, more series of interconnected vias could be included within each set, and more sets could be provided to carry additional phases of current.

Figure 19:
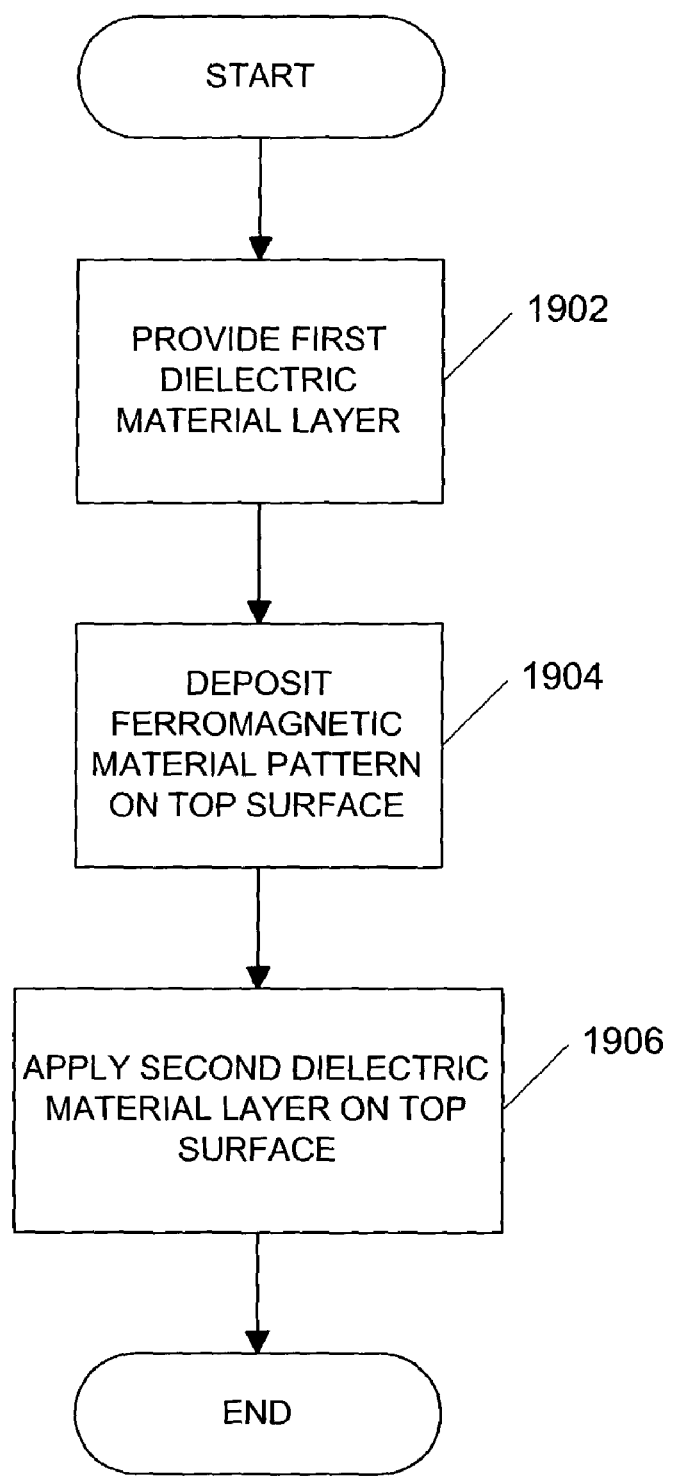
FIG. 19 illustrates a flowchart of a method for providing a dielectric board with an embedded ferromagnetic material pattern in accordance with one embodiment of the present invention.

The inductive properties of the embedded filter structures described above can be enhanced by providing a ferromagnetic material embedded within the dielectric board. FIG. 19 illustrates a flowchart of a method for providing a dielectric board (see block 302, FIG. 3) with an embedded ferromagnetic material pattern in accordance with one embodiment of the present invention. The method of FIG. 19 should be viewed in conjunction with FIGS. 20–29, which are schematic cross sections and top views illustrating various stages of fabricating an embedded filter or transformer in accordance with one embodiment of the present invention.

Figure 20:
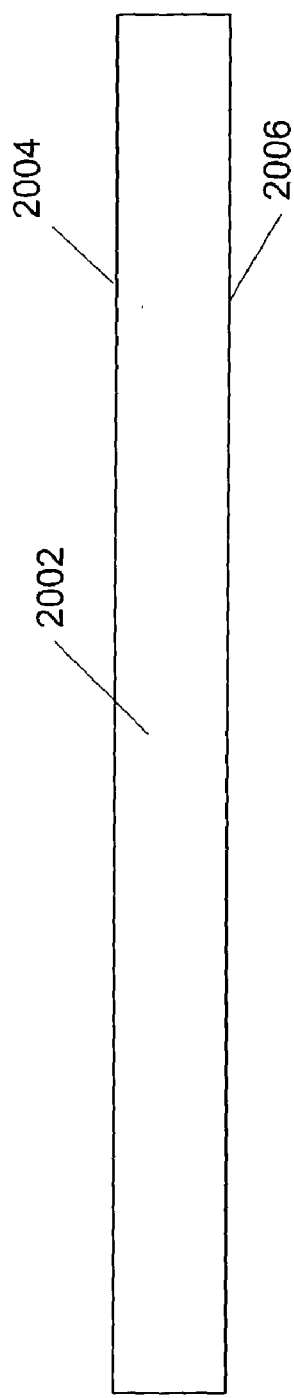
FIGS. 20–27 are schematic cross sections and top views illustrating various stages of fabricating an embedded filter or transformer in accordance with one embodiment of the present invention.
Figure 21:
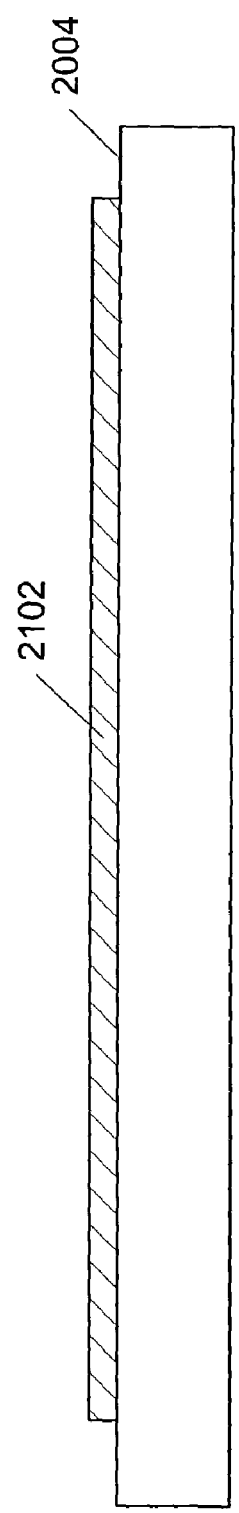

The method begins, in block 1902, by providing a first dielectric material layer (2002, FIG. 20). The dielectric material layer has a top surface 2004 and a bottom surface 2006, and can consist of a material that is the same as the materials discussed in conjunction with block 302 of FIG. 3. In various embodiments, the thickness of first dielectric material layer 2002 is within a range of 300–500 microns, with it being approximately 400 microns in one embodiment. First dielectric material layer 2002 could be thicker or thinner than this range in other embodiments.

In block 1904, a ferromagnetic material pattern (2102, FIG. 21) is deposited on the top surface 2004. In one embodiment, the ferromagnetic material pattern 2102 is deposited using an electrolytic plating and etching process. In another embodiment, pattern 2102 is deposited using a photoimaging technique. In various embodiments, the thickness of ferromagnetic material pattern 2102 is within a range of 5–50 microns, with it being approximately 30 microns in one embodiment. Ferromagnetic material pattern 2102 could be thicker or thinner than this range in other embodiments.

The ferromagnetic material used to create pattern 2102 can be selected, in part, based on the magnetic permeability of the material. One material that could be used, for example, is silicon-iron, although other magnetic materials could be used in other embodiments.

Figure 22:
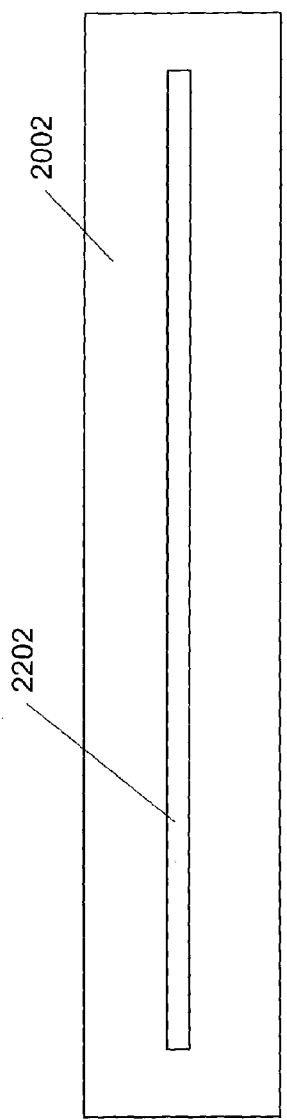
Figure 23:
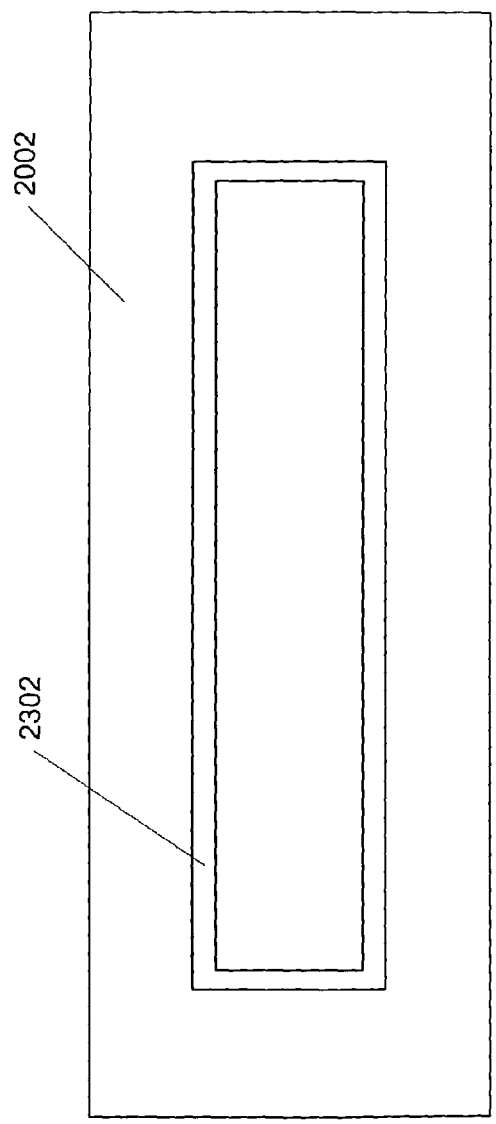
Figure 24:
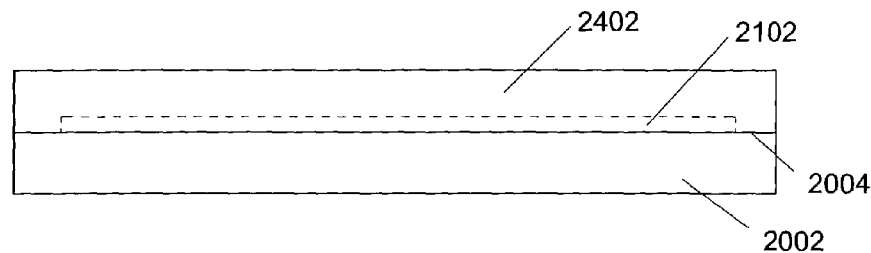
Figure 25:
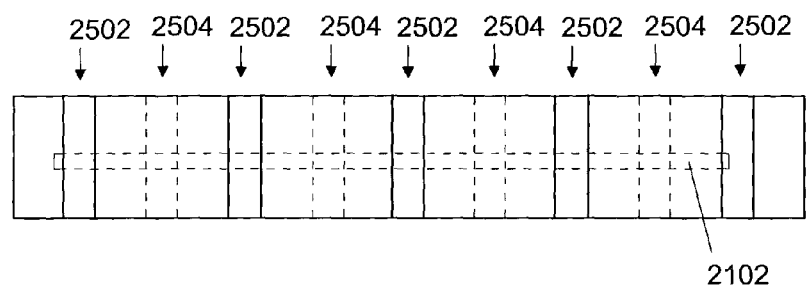

The ferromagnetic material pattern can take any of a number of shapes, and can have a range of widths. For example, FIG. 22 illustrates a top view of dielectric material layer 2002 upon which a ferromagnetic material strip 2202 is deposited. FIG. 23, on the other hand, illustrates a top view of dielectric material layer 2002 upon which a rectangular ferromagnetic pattern 2302 is deposited. This pattern can be used, for example, as a core of a transformer structure, as will be described in detail in conjunction with FIG. 33, although other closed-ended shapes, such as an oval or circle, also could be used to provide a transformer core.

Referring back to FIG. 19, a second dielectric material layer (2402, FIG. 24) is then applied to the top surface 2004 of the first dielectric material layer 2002 over the ferromagnetic material pattern 2102. In one embodiment, second dielectric material layer 2402 is laminated to first dielectric material layer 2002. In various embodiments, the thickness of second dielectric material layer 2402 is within a range of 300–500 microns, with it being approximately 400 microns in one embodiment. Second dielectric material layer 2402 could be thicker or thinner than this range in other embodiments.

After the second dielectric material layer 2402 is applied, the method of fabricating the interconnect structures in accordance with various embodiments of the present invention follows the procedure described in FIG. 3. Specifically, in block 304, one or more series of holes (2502, 2504, FIG. 25) are formed through the dielectric board. These holes are illustrated in the cross-sectional view of FIG. 25 as being formed on one side or the other of the ferromagnetic material pattern 2102. In other words, holes 2502 are formed on a first side of ferromagnetic material pattern 2102, and holes 2504 are formed on the other side of ferromagnetic material pattern 2102.

Figure 26:
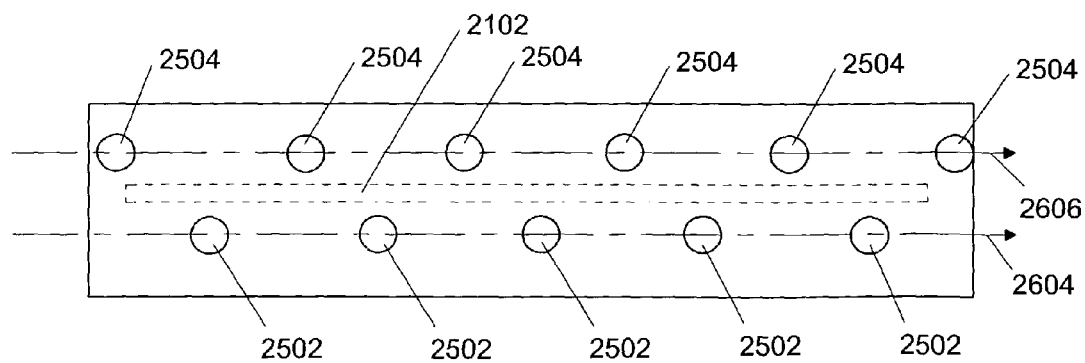

This is further illustrated in FIG. 26, which is a top view of the dielectric board having a ferromagnetic material pattern 2102 embedded therein. Holes 2502 are positioned along line 2604 on one side of ferromagnetic material pattern 2102. Holes 2504 are positioned along line 2606 on the other side of ferromagnetic material pattern 2102.

Referring again to FIG. 3, after forming one or more series of holes, blocks 306, 308, and 310 are performed. These include the procedures, described previously, of plating the holes and the top and bottom surfaces, filling the holes with a conductive or non-conductive material, and selectively removing portions of the conductive material on the top and bottom surfaces.

Figure 27:
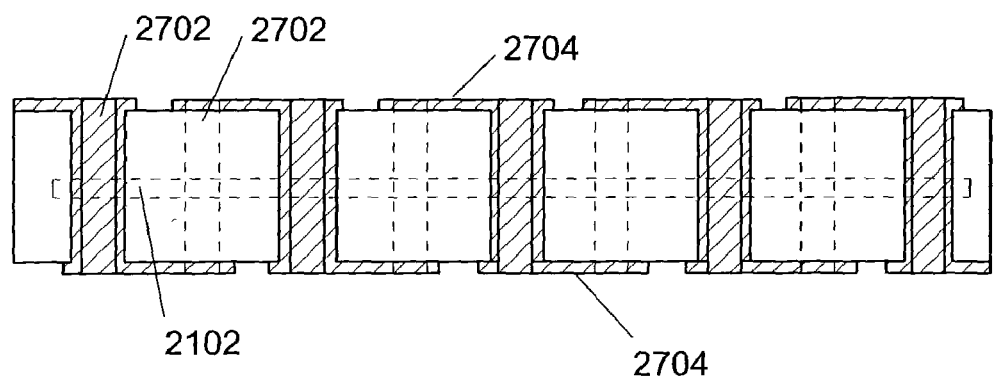

The result of this procedure is illustrated in FIG. 27, which illustrates a schematic cross section of a structure that includes a series of interconnected PTH vias in accordance with one embodiment. As described previously, the filled PTH vias 2702 are located on both sides of the embedded ferromagnetic material pattern 2102. The conductive traces 2704 on the top and bottom surfaces of the dielectric board provide electrical connections between adjacent PTH vias. Thus, the traces 2704 and vias 2702 form a coil-like inductive structure having a ferromagnetic strip embedded in the center of the coil.

Figure 28:
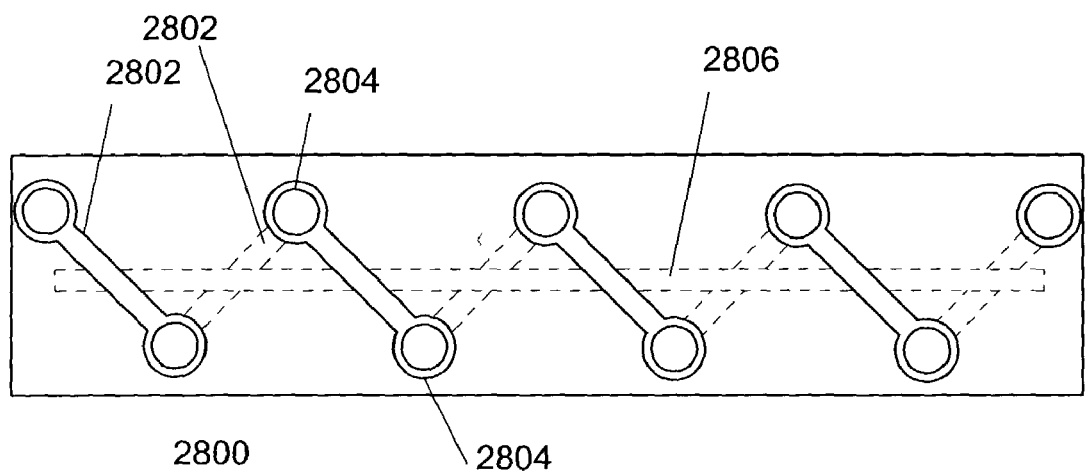
FIG. 28 illustrates a top view of a single-phase, coil-type inductive filter with a ferromagnetic core in accordance with one embodiment of the present invention.

FIG. 28 illustrates a top view of a single-phase, coil-type inductive filter 2800 with a ferromagnetic core in accordance with one embodiment of the present invention. The structure of traces 2802 and PTH vias 2804 is similar to the structure described in conjunction with FIG. 13, except that an embedded ferromagnetic pattern 2806 is deposited through the center of the coil-like structure.

The single-phase, coil-type inductive filter structure 2800 shown in FIG. 28 could form a part of various other embodiments of inductive filters. For example, in one embodiment, multiple structures 2800 could be provided to form a multi-phase, coil-type inductive filter similar to that described in conjunction with FIG. 14, except where each series of PTH vias coils around a ferromagnetic core. In another embodiment, multiple structures 2800 could be provided and electrically connected by a linking portion to provide a low-resistance, single-phase, coil-type inductive filter similar to that described in conjunction with FIG. 16, except where each series of PTH vias coils around a ferromagnetic core. Finally, in another embodiment, multiple structures 2800 could be provided to form a low-resistance, multi-phase, coil-type inductive filter similar to that described in conjunction with FIG. 17, except where each series of PTH vias coils around a ferromagnetic core.

As explained previously, the interconnected PTH via structure could also be used to form an embedded transformer structure. Basically, this is done by providing a dielectric board with an embedded ferromagnetic core having a closed-ended pattern, such as a rectangle, square, circle, or oval, for example. The method of FIG. 3 is then performed to produce two interconnected via structures coiled around the core.

Figure 29:
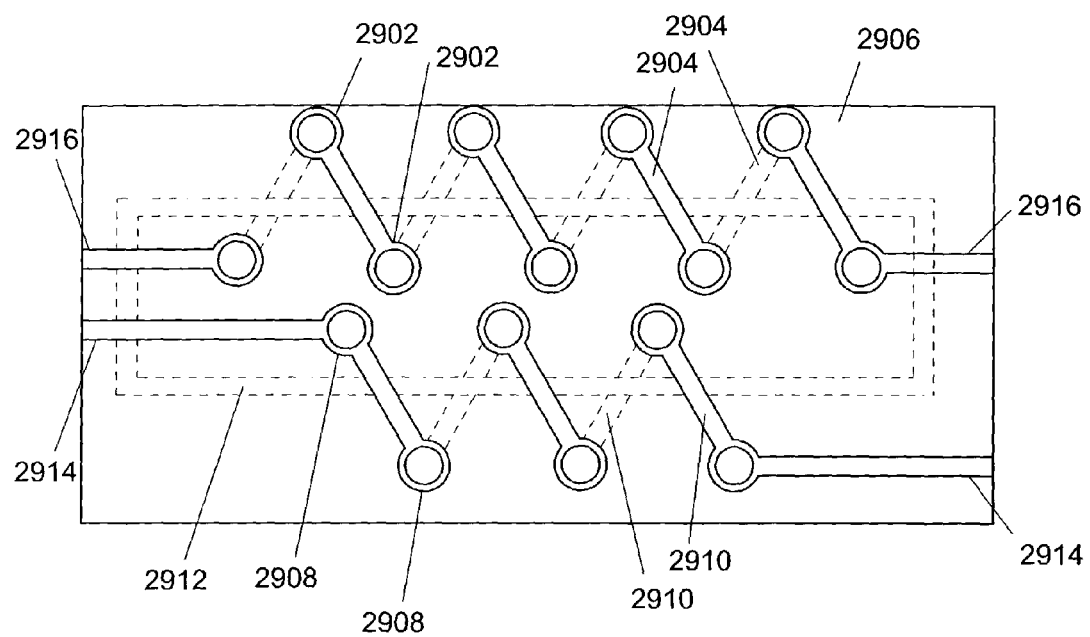
FIG. 29 illustrates a top view of a transformer in accordance with one embodiment of the present invention.

FIG. 29 illustrates a top view of a transformer in accordance with one embodiment of the present invention. The transformer includes two series of interconnected PTH vias, each having a coil-type inductor structure.

A first series includes PTH vias 2902 that are interconnected by traces 2904 on the top and bottom surfaces of dielectric board 2906. A second series includes PTH vias 2908 that are interconnected by traces 2910 on the top and bottom surfaces of dielectric board 2906. A ferromagnetic core 2912 is embedded in dielectric board 2906. The coils formed by both the first and second series of PTH vias wind around core 2912. Core 2912 is shown having a rectangular pattern in FIG. 29. In other embodiments, other closed-ended shapes also could be used.

In accordance with standard transformer behavior, when current is applied to the first series of PTH vias 2902, a current is induced in the second series 2908. Because the number of coils in the first series is different from the number of coils in the second series, the induced output voltage, Vout, between leads 2914 of the second series will be different from the input voltage, Vin, between leads 2916 of the first series. In alternate embodiments, the voltage difference also could be achieved using geometrically different coil configurations. Although FIG. 29 illustrates four coils in the first series, and two and a half coils in the second series, more or fewer coils could be included in either series. In addition, the dimensions of the coils could be varied, for example, by adjusting the distances and angles between adjacent PTH vias.

Figure 30:
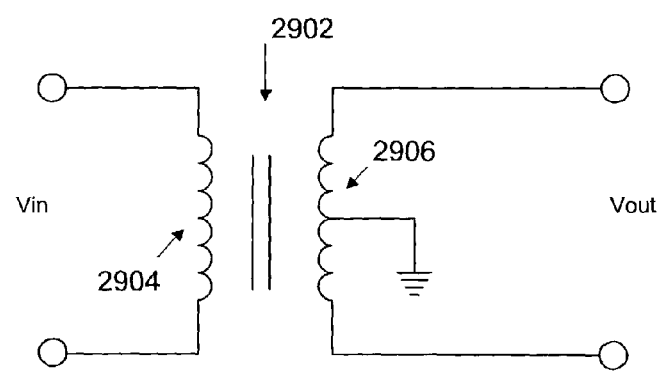
FIG. 30 illustrates an electrical circuit that simulates the electrical characteristics of the transformer illustrated in FIG. 29.

FIG. 30 illustrates an electrical circuit that simulates the electrical characteristics of the transformer illustrated in FIG. 29. The circuit includes a transformer 2902 having a first coil 2904 and a second coil 2906. The voltage, Vin, applied across the first coil 2904 is transformed to a different voltage, Vout, across the second coil 2906.

Embedded inductive filters and/or transformers such as those shown in FIGS. 10, 11, 13–18, 28, and 29 could be used in many applications where a filter or transformer is needed, but where it is desirable not to use a discrete device. In addition, embedded inductive filters and/or transformers could be used in many applications where it is desirable to place a filter or transformer on an IC package, interposer or PC board.

FIG. 31 illustrates the incorporation of one or more embedded series of interconnected PTH vias 3102 in an IC package 3104 in accordance with one embodiment of the present invention. Starting from the top of FIG. 31, an integrated circuit 3106 is housed by IC package 3104. Integrated circuit 3106 contains one or more circuits which are electrically connected to IC package 3104 by connectors 3108. One or more of these circuits act as loads (e.g., load 122, FIG. 1) to which power is supplied by VRM 3110.

Integrated circuit 3106 could be any of a number of types of integrated circuits. In one embodiment of the present invention, integrated circuit 3106 is an microprocessor, although integrated circuit 3106 could be other devices in other embodiments. In the example shown, integrated circuit 3106 is a "flip chip" type of integrated circuit, meaning that the input/output terminations on the chip can occur at any point on its surface. After the chip has been readied for attachment to IC package 3104, it is flipped over and attached, via solder bumps or balls 3108 to matching pads on the top surface 3114 of IC package 3104. Alternatively, integrated circuit 3106 could be a surface mount chip, where input/output terminations are connected to IC package 3104 using bond wires to pads on the top surface 3114 of IC package 3104.

IC package 3104 is coupled to a socket 3116 on a PC board 3118. In the example shown, IC package 3104 includes pins 3120 that mate with complementary pin holes in socket 3116. Alternatively, IC package 3104 could be electrically and physically connected to PC board 3118 using solder connections, such as ball grid array connections, for example.

PC board 3118 could be, for example, a mother board of a computer system. As such, it acts as a vehicle to supply power to VRM 3110 and, thus, integrated circuit 3106. This power is supplied through traces (not shown) on PC board 3118, socket 3116, pins 3118, and traces (not shown) on IC package 3104.

In one embodiment, PC board 3118 supplies AC power to VRM 3110. In some instances, VRM 3110 must transform the AC power to DC power before supplying that power to integrated circuit 3106. As described in conjunction with FIG. 1, AC power is transformed to DC power, in part, using a voltage transformer (e.g., transformer 112, FIG. 1). In accordance with one embodiment of the present invention, that transformer is supplied by two or more embedded series of interconnected PTH vias 3102. The fabrication and structure of this embedded transformer were described in detail in conjunction with FIGS. 19-30. In another embodiment, the transformer could be part of VRM 3110.

As also described previously, after the supply voltage has been regulated by VRM 3110, the voltage is filtered using an inductive filter, and supplied to integrated circuit 3106 through connectors 3108. In accordance with one embodiment of the present invention, the inductive filter is provided by one or more embedded series of interconnected PTH vias 3102. The fabrication and structure of this embedded inductive filter were described in detail in conjunction with FIGS. 9–28.

By providing an embedded inductive filter 3102, the discrete component-type inductive filter of the prior art can be eliminated or substantially reduced in size. This enables the VRM to be placed on the IC package 3104 and, thus, much closer to integrated circuit 3106. The proximity of the VRM to integrated circuit 3106 results in a smaller voltage drop than is possible using prior art methods of placing the VRM on PC board 3118. In addition, cost saving are achieved, because the discrete component filter is eliminated or reduced in size.

By providing an embedded transformer 3102, the transformer typically included in the VRM in prior art systems can be removed from the VRM. Thus, the size of the VRM can be reduced, further facilitating the placement of the VRM on the IC package 3104. From the above description, it should be apparent that the embedded series of interconnected PTH vias 3102 can be used for either an embedded transformer, an embedded inductive filter, or both.

As explained previously, integrated circuit packages are sometimes connected to a PC board through an interposer, which acts as a dimensional interface between IC package connectors and connectors on the PC board. When an interposer is present, the VRM and/or the series of interconnected PTH vias can be moved onto the interposer.

FIG. 32 illustrates the incorporation of one or more embedded series of interconnected PTH vias 3202, 3204 in an interposer 3206 and/or IC package 3208 in accordance with one embodiment of the present invention. Interposer 3206 is present between IC package 3208 and PC board 3210. IC package 3208 could be connected to interposer 3206 using solder connections 3212 or pin connections. Similarly, interposer 3206 could be connected to PC board 3210 using pin connections 3214 or solder connections.

VRM 3216 is located on interposer 3206. Similar to the embodiment depicted in FIG. 31, two or more series of interconnected PTH vias 3202 could serve as a transformer of power supplied to VRM 3216 from PC board 3210. One or more series of interconnected PTH vias 3202 also could serve as an inductive filter between VRM 3216 and integrated circuit 3218.

In one embodiment, an additional inductive filter 3204 is located on the IC package 3208, as well. If the inductive filter is provided by interconnected PTH vias on both the interposer 3206 and the IC package 3208, a circuit diagram of the filter would resemble two inductors connected in series between VRM 3216 and the integrated circuit 3218. In alternate embodiments, the entire inductive filter is located on either IC package 3208 or interposer 3206.

The IC packages and interposer described in conjunction with FIGS. 31 and 32 could be connected to a PC board forming part of a general purpose computer system. FIG. 33 illustrates a general purpose computer system 3300 that includes an embedded inductive filter and/or transformer in accordance with various embodiments of the present invention.

Computer system 3300 is housed on PC board 3302, and includes bus 3308, microprocessor 3304, package 3306, power supply signal generator 3310, and memory 3312. Package and/or interposer 3306 couples microprocessor 3304 to bus 3308 in order to communicate power supply signals and non-power supply signals between microprocessor 3304 and devices coupled to bus 3308. For the embodiment of the present invention shown in FIG. 33, bus 3308 couples microprocessor 3304 to memory 3312 and power supply signal generator 3310. However, it is to be understood that in alternative embodiments of the present invention, microprocessor 3304 can be coupled to memory 3312 and power supply signal generator 3310 through two different busses. In addition, in alternative embodiments of the present invention, power supply signal generator 3310 is not positioned on PC board 3302, but instead is positioned elsewhere.

Thus, various embodiments of an interconnected PTH via structure and methods of fabricating that structure have been described, along with a description of the incorporation of a package and/or interposer that includes that structure on a PC board within a general purpose computer system.

The method and apparatus of the present invention provide a circuit configuration having a VRM closer to the integrated circuit than is possible using prior art methods and apparatuses. This is accomplished without requiring a substantially larger interposer or IC package. In addition, use of the method and apparatus of the present invention results in a reduction in the amount of surface area required by a VRM or its associated inductive filter.

CONCLUSION

Embodiments of the present invention provide an embedded inductive filter and an embedded transformer that can be used in place of various discrete components on an integrated circuit package, interposer or printed circuit board.

In the foregoing detailed description of the preferred embodiments, reference is made to the accompanying drawings which form a part hereof, and in which are shown by way of illustration specific preferred embodiments in which the invention may be practiced. These embodiments are described in sufficient detail to enable those skilled in the art to practice the invention.

It will be appreciated by those of ordinary skill in the art that any arrangement which is calculated to achieve the same purpose may be substituted for the specific embodiment shown. For example, illustrative embodiments describe vias between two levels of interconnect. However, those skilled in the art will recognize that many interconnect levels may be connected by vias in accordance with the present invention.

The present invention has been described in the context of providing an embedded inductive filter or transformer in a VRM application. One of ordinary skill in the art would understand, based on the description herein, that the method and apparatus of the present invention could also be applied in many other applications where an embedded inductive filter or transformer are desired. Therefore, all such applications are intended to fall within the spirit and scope of the present invention.

In addition, the terms "chip," "integrated circuit," "monolithic device," "semiconductor device," and "microelectronic device" are often used interchangeably in this field. The present invention is applicable to all the above as they are generally understood in the field.

This application is intended to cover any adaptations or variations of the present invention. The foregoing detailed description is, therefore, not to be taken in a limiting sense, and it will be readily understood by those skilled in the art that various other changes in the details, materials, and arrangements of the parts and steps which have been described and illustrated in order to explain the nature of this invention may be made without departing from the spirit and scope of the invention as expressed in the adjoining claims.

What is claimed is:

1. An inductive filter comprising:
    a dielectric board having a top surface and a bottom surface;
    a series of plated through hole (PTH) vias formed in the dielectric board;
    conductive material traces on the top surface and the bottom surface that electrically connect the PTH vias, wherein adjacent PTH vias are electrically connected by a trace on either the top surface or the bottom surface, and wherein the adjacent PTH vias in the series alternate between being electrically connected by a trace on the top surface or electrically connected by a trace on the bottom surface;
    at least one additional series of PTH vias formed in the dielectric board; and
    additional conductive material traces on the top surface and the bottom surface that electrically connect each of the PTH vias in the at least one additional series, wherein adjacent PTH vias in the at least one additional series alternate between being electrically connected by traces on the top surface or the bottom surface.

2. The inductive filter as claimed in claim 1, wherein the dielectric board comprises a ferromagnetic material pattern embedded therein.

3. The inductive filter series as claimed in claim 1, wherein the PTH vias are filled with a conductive material.

4. The inductive filter as claimed in claim 1, wherein the PTH vias in the series and in the additional series are substantially collinear.

5. The inductive filter as claimed in claim 1, wherein the series and the additional series of PTH vias each form a coil-like structure.

6. The inductive filter as claimed in claim 5, wherein the dielectric board comprises an embedded ferromagnetic material pattern, and each of the coil-like structures winds around the embedded ferromagnetic material pattern.

7. The inductive filter as claimed in claim 1, wherein the first series is electrically isolated from the at least one additional series.

8. The inductive filter as claimed in claim 1, wherein a linking portion of conductive material electrically connects at least one PTH via in each of the first series and the at least one additional series.

\* \* \* \* \*

UNITED STATES PATENT AND TRADEMARK OFFICE
CERTIFICATE OF CORRECTION

PATENT NO. : 7,111,271 B2 Page 1 of 1
APPLICATION NO. : 10/281752
DATED : September 19, 2006
INVENTOR(S) : Li et al.

It is certified that error appears in the above-identified patent and that said Letters Patent is hereby corrected as shown below:

On the Title page, in Item (56), under "U.S. Patent Documents", in column 2, line 4, after "6,696,910" delete "B1 *" and insert -- B2 * --, therefor.

On the Title page, in Item (56), under "U.S. Patent Documents", in column 2, line 6, after "6,740,222" delete "B1 *" and insert -- B2 * --, therefor.

In column 16, line 31, in Claim 3, after "filter" delete "series".

Signed and Sealed this

Nineteenth Day of December, 2006

JON W. DUDAS
*Director of the United States Patent and Trademark Office*